United States Patent
Lin

(10) Patent No.: US 11,233,590 B2
(45) Date of Patent: Jan. 25, 2022

(54) VOLTAGE DETECTOR AND COMMUNICATION CIRCUIT INCLUDING VOLTAGE DETECTOR

(71) Applicant: REALTEK SEMICONDUCTOR CORPORATION, Hsinchu (TW)

(72) Inventor: Chung-Yu Lin, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 343 days.

(21) Appl. No.: 16/224,873

(22) Filed: Dec. 19, 2018

(65) Prior Publication Data

US 2019/0199459 A1 Jun. 27, 2019

(30) Foreign Application Priority Data

Dec. 21, 2017 (TW) ................ 106145019

(51) Int. Cl.
| | |
|---|---|
| *H04B 17/318* | (2015.01) |
| *H04B 17/40* | (2015.01) |
| *G01R 19/165* | (2006.01) |
| *H03F 3/345* | (2006.01) |
| *H03F 3/193* | (2006.01) |

(52) U.S. Cl.
CPC ......... *H04B 17/318* (2015.01); *G01R 19/165* (2013.01); *H03F 3/193* (2013.01); *H03F 3/345* (2013.01); *H04B 17/409* (2015.01); *H03F 2200/294* (2013.01); *H03F 2200/451* (2013.01); *H03F 2200/471* (2013.01)

(58) Field of Classification Search
CPC .. H04B 17/318; H04B 17/409; G01R 19/165; H03F 3/193; H03F 3/345; H03F 2200/294; H03F 2200/451; H03F 2200/471

USPC ........................................................ 361/1
See application file for complete search history.

(56) References Cited

U.S. PATENT DOCUMENTS

| | | | | |
|---|---|---|---|---|
| 5,163,021 A | * | 11/1992 | Mehrotra | G11C 7/04 330/2 |
| 6,836,156 B2 | | 12/2004 | Chien | |
| 6,977,531 B2 | | 12/2005 | Chien | |
| 7,652,535 B2 | * | 1/2010 | Singh | H03F 3/45192 330/258 |
| 9,077,445 B2 | | 7/2015 | Rajavi et al. | |
| 2004/0212401 A1 | * | 10/2004 | Chien | G01R 19/04 327/58 |

(Continued)

*Primary Examiner* — Thienvu V Tran
*Assistant Examiner* — Sreeya Sreevatsa
(74) *Attorney, Agent, or Firm* — WPAT, PC

(57) ABSTRACT

Disclosed is a voltage detector and a communication circuit capable of detecting a low input voltage. The voltage detector includes: an alternating-current coupling circuit generating a first and a second input voltages according to a source input voltage; a feedback amplifier outputting a branch current according to a sink current including the branch current, and determining an output voltage according to the first input voltage and the amount of the branch current; and an auxiliary circuit outputting the amount of the sink current according to the second input voltage. When the sink current increases as the second input voltage rises, the branch current also increases, so that the output voltage not only rises as the first input voltage rises but also rises as the branch current increases. This feature allows a lower input voltage to be detectable by the detection of the risen output voltage.

16 Claims, 10 Drawing Sheets

(56) References Cited

U.S. PATENT DOCUMENTS

2007/0115030 A1\* 5/2007 Bhattacharya ...... H04L 25/0276
326/83

\* cited by examiner

US 11,233,590 B2

VOLTAGE DETECTOR AND COMMUNICATION CIRCUIT INCLUDING VOLTAGE DETECTOR

BACKGROUND OF THE INVENTION

1. Field of the Invention

The present invention relates to a voltage detector and a communication circuit, especially to a voltage detector and a communication circuit capable of detecting a low input voltage.

2. Description of Related Art

A general wireless communication circuit amplifies a reception signal according to a gain (e.g., a gain of a low noise amplifier (LNA)) and thereby generates an input signal to be processed by a back-end circuit. However, if the voltage of the input signal is excessively high, the input signal may damage the back-end circuit. Therefore, in order to prevent the above-mentioned problem, the wireless communication circuit usually includes a voltage detector to detect whether the voltage of the input signal exceeds a threshold voltage, and if the detection result is positive, the wireless communication circuit will reduce the gain.

FIG. 1 shows the relation between the voltage of the aforementioned input signal voltage swing amplitude $V_{IN}$, the voltage of an output signal $V_{OUT}$ and the aforementioned threshold voltage $V_{TH}$. As shown in FIG. 1, when $V_{IN}$ is greater than a voltage $V_1$, $V_{OUT}$ is greater than $V_{TH}$. However, as the development of techniques improves, the complexity of circuit operation increases and the detection capability of the aforementioned voltage detector should be improved as well to be able to detect a voltage lower than the voltage $V_1$; in other words, when $V_{IN}$ is lower than $V_1$ (as shown in FIG. 2, in which $V_2$ is lower than $V_1$), the voltage detector should be able to generate a result indicating $V_{OUT}$ greater than $V_{TH}$ so as to achieve the requirement of detection capability.

SUMMARY OF THE INVENTION

An object of the present invention is to provide a voltage detector and a communication circuit. The voltage detector and the communication circuit are capable of detecting a lower input voltage in comparison with the prior art, and thereby favorable for the immediate adjustment of circuit parameters. As a result, the voltage detector and the communication circuit can prevent an excessively high input voltage from damaging a back-end circuit.

According to an embodiment of the present invention, the voltage detector includes an alternating-current (AC) coupling circuit, a feedback amplifier and an auxiliary circuit. The AC coupling circuit is configured to generate a first input voltage and a second input voltage according to a source input voltage. The feedback amplifier is configured to output a branch current according to a sink current and determine an output voltage according to the first input voltage and the amount of the branch current. The auxiliary circuit is configured to output the amount of the sink current according to the second input voltage, in which the sink current includes the branch current. In this embodiment, the output voltage not only rises as the first input voltage rises but also rises as the sink current increases. Therefore, providing the input voltages for the present invention and the prior art are the same, the output voltage of the present invention is higher than that of the prior art and thereby favorable for detection.

According to an embodiment of the present invention, the communication circuit includes a radio-frequency (RF) circuit, a voltage detector, a comparing circuit and a gain adjusting circuit. The RF circuit is configured to process a reception signal according to an amplifier gain and thereby generate a source input voltage. The voltage detector includes: an alternating-current (AC) coupling circuit configured to generate a first input voltage and a second input voltage according to the source input voltage; a feedback amplifier configured to output a branch current according to a sink current and determine an output voltage according to the first input voltage and the amount of the branch current; and an auxiliary circuit configured to output the amount of the sink current according to the second input voltage, in which the sink current includes the branch current. The comparing circuit is configured to compare the output voltage with a threshold voltage and thereby generate a voltage detection result. The gain adjusting circuit is configured to adjust the amplifier gain according to the voltage detection result.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

Figure 1:
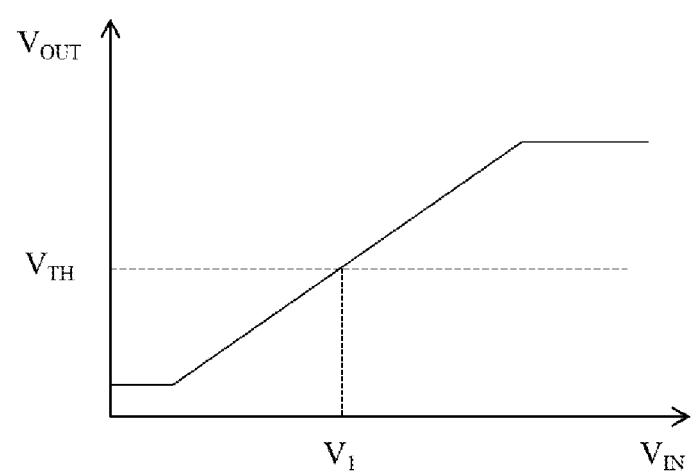
FIG. 1 shows the efficacy of the prior art executing voltage detection.
Figure 2:
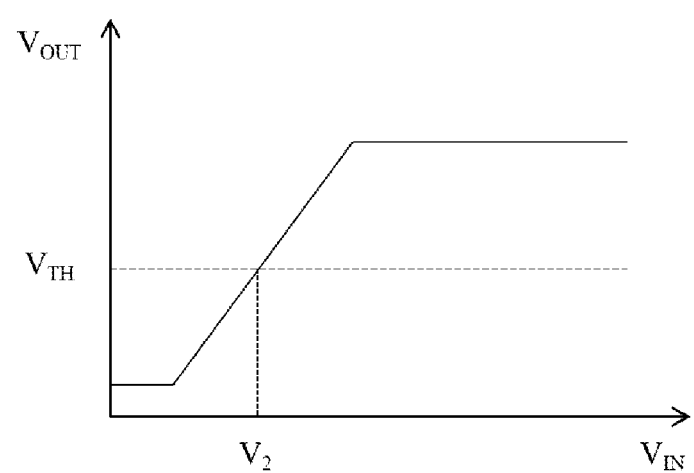
FIG. 2 shows the efficacy of the present invention executing voltage detection.

The present invention discloses a voltage detector and a communication circuit. In comparison with the prior art, the present invention is capable of detecting a lower input voltage and thereby favorable for the immediate adjustment of circuit parameters; as a result, the present invention can prevent an excessively high input voltage from damaging a back-end circuit. FIG. 2 shows the efficacy of the present invention executing voltage detection. As shown in FIG. 2, $V_{IN}$ is the voltage swing amplitude of an input signal, $V_{OUT}$ is the voltage of an output signal, $V_{TH}$ is a threshold voltage, and when $V_{IN}$ is greater than a voltage $V_2$, $V_{OUT}$ is greater than $V_{TH}$, which implies that $V_{IN}$ could be excessively high and thus one or more circuit parameter(s) (e.g., a gain of an amplifier) should be adjusted to lower $V_{IN}$. In comparison with FIG. 1 of the prior art, the voltage $V_2$ is lower than the voltage $V_1$ while $V_{TH}$ remains the same, and this shows that the present invention can detect a lower input voltage exceeding $V_{TH}$.

Figure 3:
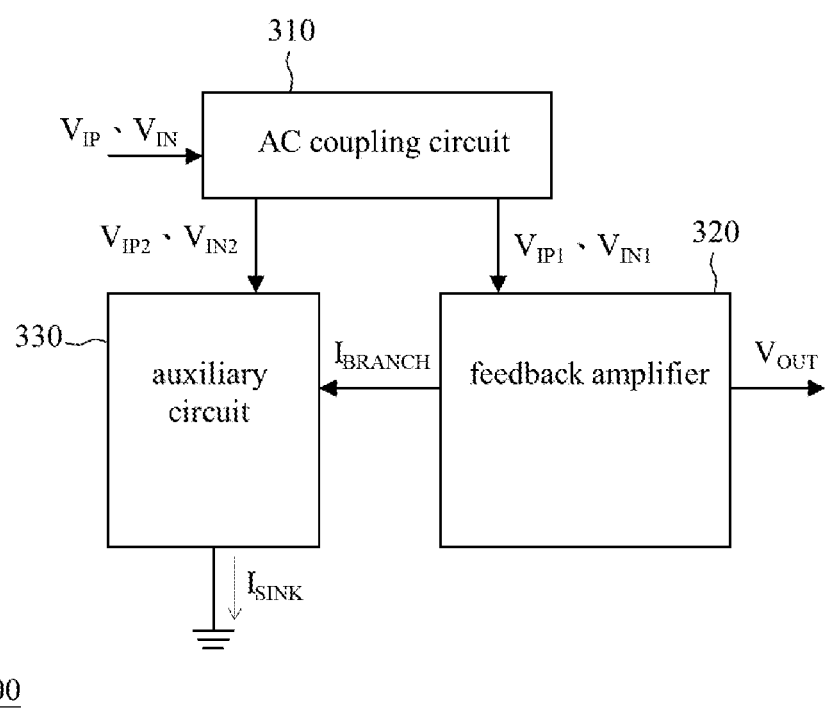
FIG. 3 shows an embodiment of the voltage detector of the present invention.

FIG. 3 shows an embodiment of the voltage detector of the present invention. As shown in FIG. 3, the voltage detector 300 includes an alternating-current (AC) coupling circuit 310, a feedback amplifier 320 and an auxiliary circuit 330. The AC coupling circuit 310 is configured to generate a first input voltage $V_{I1}$ and a second input voltage $V_{I2}$ according to a source input voltage $V_I$, in which the source input voltage $V_I$, the first input voltage $V_{I1}$ and the second input voltage $V_{I2}$ are differential voltages in this embodiment. The source input voltage $V_I$ is composed of voltages $V_{IP}$ and $V_{IN}$ of a differential signal, the first input voltage $V_{I1}$ is composed of voltages $V_{IP1}$ and $V_{IN1}$ of another differential signal and the second input voltage $V_{I2}$ is composed of voltages $V_{IP2}$ and $V_{IN2}$ of yet another differential signal; however, this is just exemplary for understanding. When the source input voltage $V_1$ is greater than the voltage $V_2$ of FIG. 2, the feedback amplifier 320 is configured to output a branch current $I_{BRANCH}$ according to a sink current $I_{SINK}$, in which the branch current $I_{BRANCH}$ is a part of the sink current $I_{SINK}$. Furthermore, the feedback amplifier 320 is configured to determine an output voltage $V_{OUT}$ according to $V_{IP1}$ and $V_{IN1}$ of the first input voltage $V_{I1}$ and according to the amount of the branch current $I_{BRANCH}$. The auxiliary circuit 330 is configured to output the amount of the sink current $I_{SINK}$ according to $V_{IP2}$ and $V_{IN2}$ of the second input voltage $V_{I2}$, in which when the amount of the branch current $I_{BRANCH}$ is greater than zero, the sink current $I_{SINK}$ includes the branch current $I_{BRANCH}$ and the branch current $I_{BRANCH}$ is proportional to the sink current $I_{SINK}$. As a result, when the sink current $I_{SINK}$ increases as $V_{IP2}$ and $V_{IN2}$ of the second input voltage $V_{I2}$ rise (i.e., $|V_{IP2}-V_{IN2}|$ increases), the branch current $I_{BRANCH}$ increases as well; therefore, the output voltage $V_{OUT}$ not only rises as $V_{IP1}$ and $V_{IN1}$ of the first input voltage $V_{I1}$ rise (i.e., $|V_{IP1}-V_{IN1}|$ increases) but also rises as the branch current $I_{BRANCH}$ increases, which has the ratio $$\left(\text{i.e., } \frac{\Delta V_{OUT}}{\Delta |V_{IP} - V_{IN}|}\right)$$

of the variation of the output voltage $V_{OUT}$ (i.e., $\Delta V_{OUT}$) to the variation of $V_{IP}$ and $V_{IN}$ of the source input voltage $V_I$ (i.e., $\Delta |V_{IP}-V_{IN}|$) vary sharply (i.e., the slope of the ratio's variation increase) and has the source input voltage $V_I$ be more detectable by the detection of the variation of the output voltage $V_{OUT}$. In the figures, the symbol of grounding stands for the connection to a low voltage terminal $V_{SS}$ (e.g., a grounding terminal).

Figure 4:
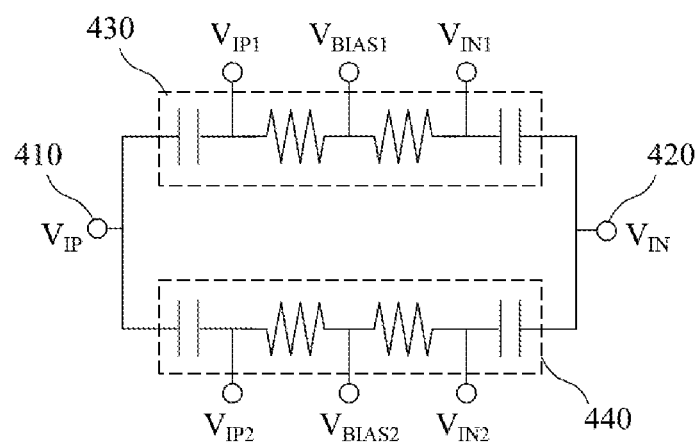
FIG. 4 shows an embodiment of the AC coupling circuit of FIG. 3.

FIG. 4 shows an embodiment of the AC coupling circuit 310 of FIG. 3. As shown in FIG. 4, the AC coupling circuit 310 includes a first terminal 410, a second terminal 420, a first AC coupling circuit 430 and a second AC coupling circuit 440. The first terminal 410 is configured to receive the positive-terminal input $V_{IP}$ of the source input voltage $V_I$. The second terminal 420 is configured to receive the negative-terminal input $V_{IN}$ of the source input voltage $V_I$. The first AC coupling circuit 430 includes capacitors and resistors operable to filter direct-current (DC) components and generate the aforementioned $V_{IP1}$ and $V_{IN1}$ of the first input voltage $V_{I1}$ according to the positive-terminal input $V_{IP}$, the negative-terminal input $V_{IN}$ and a first bias $V_{BIAS1}$. The second AC coupling circuit 440 includes capacitors and resistors operable to filter DC components and generate the aforementioned $V_{IP2}$ and $V_{IN2}$ of the second input voltage $V_{I2}$ according to the positive-terminal input $V_{IP}$, the negative-terminal input $V_{IN}$ and a second bias $V_{BIAS2}$.

Figure 5:
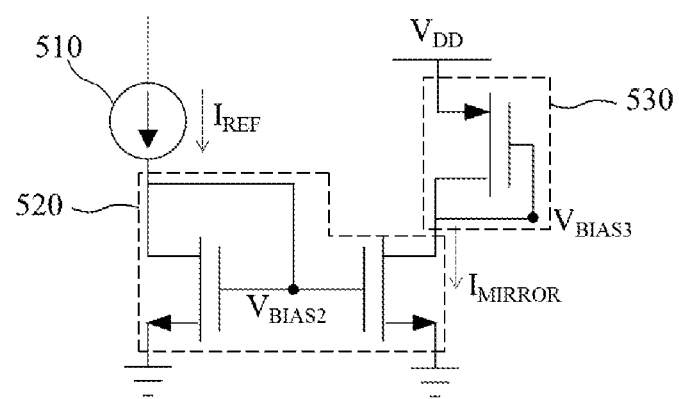
FIG. 5 shows an embodiment of the bias generating circuit of the present invention.

The aforementioned first bias $V_{BIAS1}$ can be determined by a person carrying out the present invention in view of her/his demand. The aforementioned second bias $V_{BIAS2}$ can be provided by a bias generating circuit. FIG. 5 shows an embodiment of the said bias generating circuit. The bias generating circuit 500 of FIG. 5 is coupled to a high voltage terminal $V_{DD}$ and a low voltage terminal $V_{SS}$ (e.g., a grounding terminal) and includes a bias current source 510, a bias current mirror 520 and a diode-connected transistor 530. The bias current source 510 is configured to determine a reference current $I_{REF}$ and is optionally connected with other circuits (as indicated by the dotted line connecting with the bias current source 510). The bias current mirror 520 is configured to generate a mirror current $I_{MIRROR}$ related to the reference current $I_{REF}$, in which the gate voltage of the bias current mirror 520 may act as the second bias $V_{BIAS2}$. The mirror current $I_{MIRROR}$ passes through the diode-connected transistor 530 and the gate voltage of the diode-connected transistor 530 may act as the below-mentioned third bias $V_{BIAS3}$. It should be noted that according to the circuit configuration of FIG. 5, the ratio of the third bias $V_{BIAS3}$ to the second bias $V_{BIAS2}$ can be constant or configurable (e.g., the bias current 520 is a known adjustable current mirror).

Figure 6:
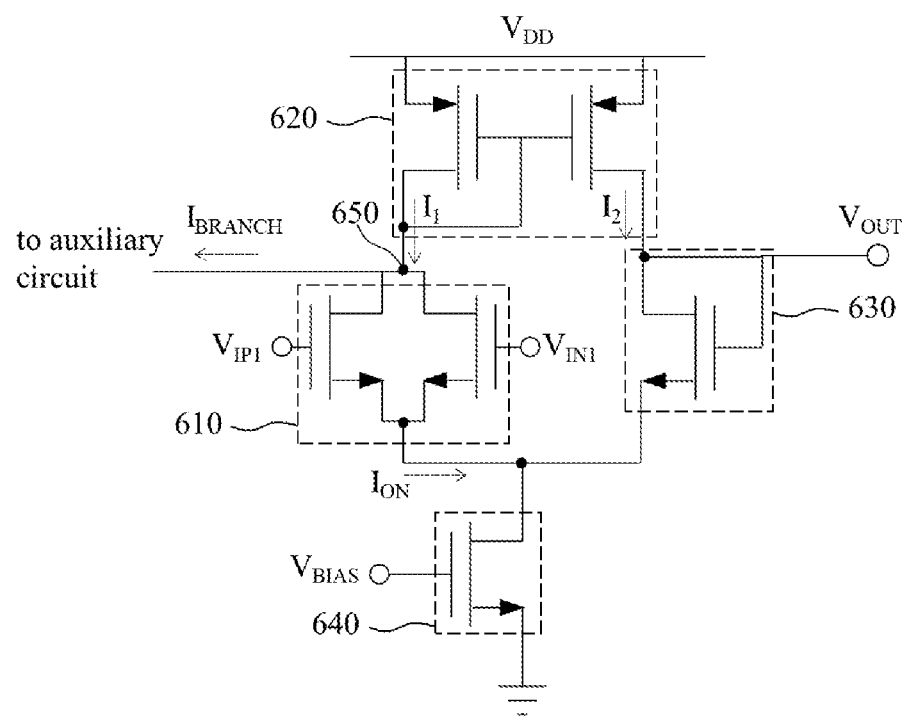
FIG. 6 shows an embodiment of the feedback amplifier of FIG. 3.

FIG. 6 shows an embodiment of the feedback amplifier 320 of FIG. 3. As shown in FIG. 6, the feedback amplifier 320 includes a first voltage input circuit 610, a current mirror circuit 620, an output feedback circuit 630 and a bias circuit 640. When the aforementioned source input voltage $V_1$ is greater than the voltage $V_2$ of FIG. 2, the first voltage input circuit 610 is configured to change a conduction current $I_{ON}$ according to the voltage swing of $V_{IP1}$ and $V_{IN1}$ of the first input voltage $V_{I1}$, in which the conduction current $I_{ON}$ passes through the first voltage input circuit 610. The current mirror circuit 620 is coupled with an output terminal 650 and configured to ensure that the ratio of a second current $I_2$ to a first current $I_1$ is constant or configurable (e.g., the current mirror circuit 620 is a known adjustable current mirror), in which the first current $I_1$ includes the aforementioned branch current $I_{BRANCH}$ and the conduction current $I_{ON}$, the branch current $I_{BRANCH}$ is outputted to the auxiliary circuit 330 through the output terminal 650 and the aforementioned output voltage $V_{OUT}$ is proportional to the second current $I_2$. The output feedback circuit 630 is coupled with the current mirror circuit 620 and configured to determine the output voltage $V_{OUT}$ according to the second current $I_2$. The bias circuit 640 is coupled with the first voltage input circuit 610 and the output feedback circuit 630 and configured to operate according to a bias $V_{BIAS}$ which could be set by a person carrying out the present invention in view of her/his demand.

Figure 7:
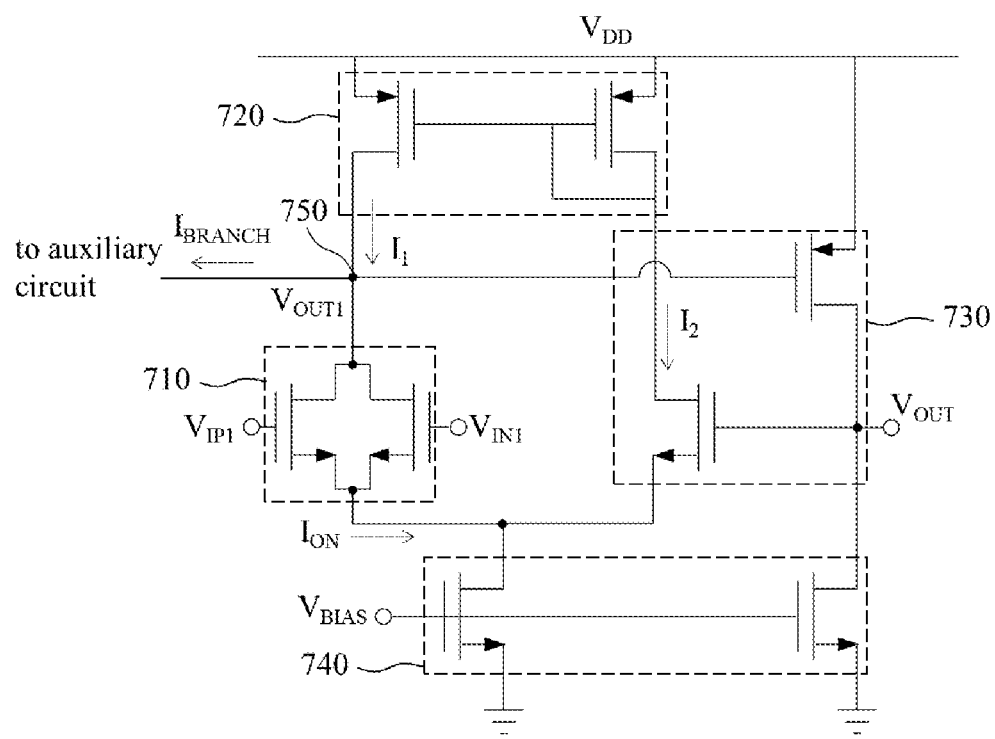
FIG. 7 shows another embodiment of the feedback amplifier of FIG. 3.

FIG. 7 shows another embodiment of the feedback amplifier 320 of FIG. 3. As shown in FIG. 7, the feedback amplifier 320 includes a first voltage input circuit 710, a current mirror circuit 720, an output feedback circuit 730 and a bias circuit 740. When the aforementioned source input voltage $V_I$ is greater than the voltage $V_2$ of FIG. 2, the first voltage input circuit 710 is configured to change a conduction current $I_{ON}$ according to the voltage swing of $V_{IP1}$ and $V_{IN1}$ of the first input voltage $V_{I1}$, in which the conduction current $I_{ON}$ passes through the first voltage input circuit 710. The current mirror circuit 720 is coupled with an output terminal 750 and configured to ensure that the ratio of a second current $I_2$ to a first current $I_1$ is constant or configurable (e.g., the current mirror circuit 720 is a known adjustable current mirror), in which the first current $I_1$ includes the aforementioned branch current $I_{BRANCH}$ and the conduction current $I_{ON}$, the branch current $I_{BRANCH}$ is outputted to the auxiliary circuit 330 through the output terminal 750. The output feedback circuit 730 is coupled with the current mirror circuit 720 and configured to determine the voltage $V_{OUT1}$ of the output terminal 750 and output the output voltage $V_{OUT}$ according to the second current $I_2$. The bias circuit 740 is coupled with the first voltage input circuit 710 and the output feedback circuit 730 and configured to operate according to a bias $V_{BIAS}$ which could be set by a person carrying out the present invention in view of her/his demand. The feedback amplifier 320 of FIG. 7 alone is a known circuit.

Figure 8:
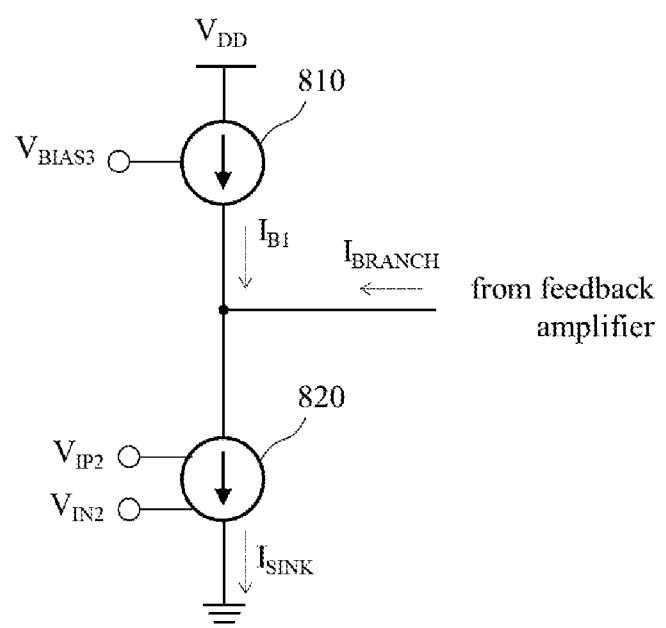
FIG. 8 shows an embodiment of the auxiliary circuit of FIG. 3.
Figure 9:
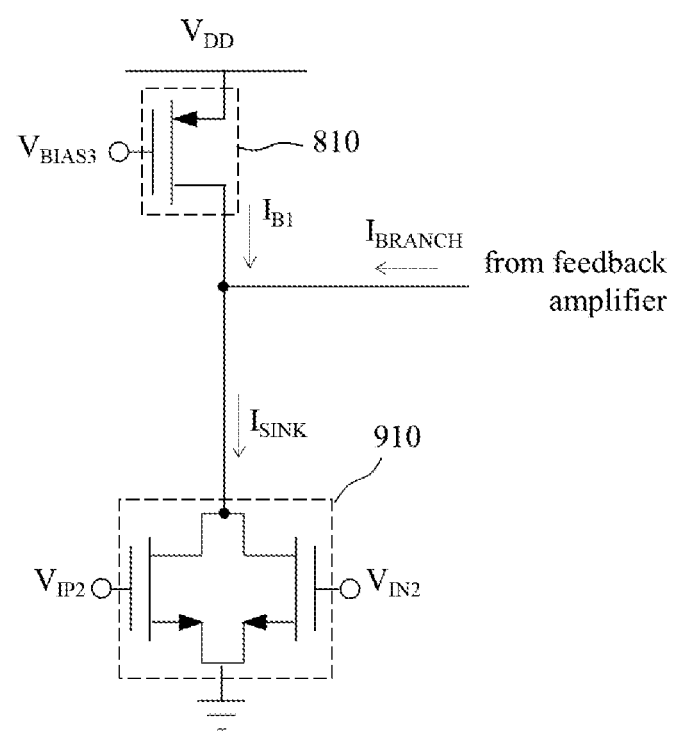
FIG. 9 shows an embodiment of the current source and the current sink of FIG. 8.

FIG. 8 shows an embodiment of the auxiliary circuit 330 of FIG. 3. As shown in FIG. 8, the auxiliary circuit 330 includes a current source 810 and a current sink 820. The current source 810 is configured to output a predetermined current $I_{B1}$ which is constant or configurable (e.g., the current source 810 is a known adjustable current source). The current sink 820 is configured to draw the aforementioned sink current $I_{SINK}$ which includes the predetermined current $I_{B1}$ and the aforementioned branch current $I_{BRANCH}$, in which the branch current $I_{BRANCH}$ is proportional to $V_{IP2}$ and $V_{IN2}$ of the second input voltage $V_{I2}$ since the predetermined current $I_{B1}$ is fixed after it is set FIG. 9 shows an embodiment of the current source 810 and the current sink 820 of FIG. 8. As shown in FIG. 9, the current source 810 includes a transistor operable to provide the predetermined current $I_{B1}$ according to the aforementioned third bias $I_{BIAS3}$; the current sink 820 includes a second voltage input circuit 910 operable to output the amount of the sink current $I_{SINK}$ (according to $V_{IP2}$ and $V_{IN2}$ of the second input voltage $V_{I2}$. It should be noted that according to the disclosure of FIG. 5, the ratio of the third bias $V_{BIAS3}$ to the second bias $V_{BIAS2}$ is constant or configurable; therefore, by the control of the ratio, when $V_{IP}$ and $V_{IN}$ of the source input voltage $V_I$ do not reach a threshold (e.g., $|V_{IP}-V_{IN}| \ll V_2$ of FIG. 2), the branch current $I_{BRANCH}$ approximates zero and the sink current $I_{SINK}$ is substantially equal to the predetermined current $I_{B1}$ (i.e., $I_{SINK}=I_{B1}+I_{BRANCH}\approx I_{B1}+0=I_{B1}$); and when $V_{IP}$ and $V_{IN}$ of the source input voltage $V_I$ reach the threshold, the sink current $I_{SINK}$ includes the predetermined current $I_{B1}$ and the branch current $I_{BRANCH}$ (i.e., $I_{SINK}=I_{B1}+I_{BRANCH}$).

Figure 10:
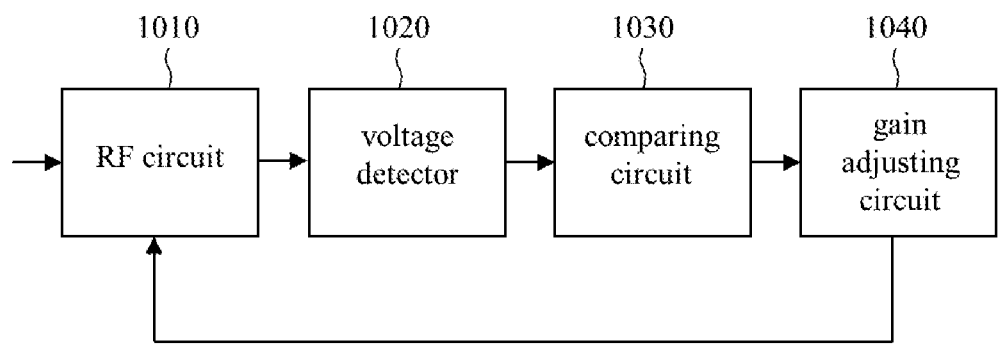
FIG. 10 shows an embodiment of the communication circuit of the present invention.

FIG. 10 shows an embodiment of the communication circuit of the present invention. As shown in FIG. 10, the communication circuit 1000 includes a radio-frequency (RF) circuit 1010, a voltage detector 1020, a comparing circuit 1030 and a gain adjusting circuit 1040. The RF circuit 1010 is configured to process a reception signal according to an amplifier gain (e.g., a gain of a low noise amplifier (LNA)) and thereby generate a source input voltage. The voltage detector 1020 is the voltage detector 300 of FIG. 3 or the equivalent thereof. The comparing circuit 1030 is configured to compare the output voltage of the voltage detector 1020 with a threshold voltage and thereby output a voltage detection result. The gain adjusting circuit 1040 (e.g., a baseband circuit) is configured to adjust the amplifier gain according to the voltage detection result; more specifically, when the voltage detection result indicates that the output voltage of the voltage detector 1020 is greater than the threshold voltage, which also indicates that the source input voltage exceeds a threshold, the gain adjusting circuit 1040 decreases the amplifier gain. People of ordinary skill in the art can appreciate that each of the RF circuit 1010, the comparing circuit 1030 and the gain adjusting circuit 1040 alone is a known or self-developed circuit.

It should be noted that the implementation of the present invention can be flexible and people of ordinary skill in the art can carry out an implementation of the present invention by using some or all of the features of at least one embodiment of the present disclosure as long as this implementation is practicable. It should also be noted that although the embodiments of the present disclosure make use of circuit configurations suitable for differential signals, those of ordinary skill in the art can appreciate that the present invention is applicable to circuit configurations suitable for single-ended signals since it is common to turn a differential signal configuration into a single-ended configuration.

To sum up, the voltage detector and the communication circuit of the present invention can detect a lower input voltage and are favorable for the immediate adjustment of circuit parameters. Therefore, the present invention can prevent an excessively high input voltage from causing damage to a back-end circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A voltage detector comprising:
   an alternating-current coupling circuit configured to generate a first input voltage and a second input voltage according to a source input voltage;
   a feedback amplifier configured to output a branch current according to a sink current and determine an output voltage according to the first input voltage and an amount of the branch current; and
   an auxiliary circuit configured to output an amount of the sink current according to the second input voltage, wherein the sink current includes a sum of a predetermined current from a current source of the auxiliary circuit and the branch current, and the branch current is not outputted from the current source.

2. The voltage detector of claim 1, wherein the feedback amplifier includes:
   a first voltage input circuit configured to determine a first output voltage of an output terminal according to the first input voltage and determine a conduction current according to the first input voltage, in which the conduction current passes through the first voltage input circuit;
   a current mirror circuit coupled to the output terminal and configured to generate a first current according to the first output voltage, in which the first current includes the branch current and the conduction current; and
   an output feedback circuit coupled to the current mirror circuit and configured to generate the output voltage.

3. The voltage detector of claim 2, wherein the current mirror circuit is configured to generate a second current while a ratio of the second current to the first current is constant or configurable and the output voltage is proportional to the second current.

4. The voltage detector of claim 2, wherein the feedback amplifier further includes a bias circuit coupled to the first voltage input circuit and the output feedback circuit.

5. The voltage detector of claim 1, wherein the auxiliary circuit includes:
the current source configured to output the predetermined current; and
a current sink configured to draw the sink current according to the second input voltage.

6. The voltage detector of claim 5, wherein the current sink includes: a second voltage input circuit configured to output the amount of the sink current according to the second input voltage.

7. The voltage detector of claim 1, further comprising: a comparing circuit configured to compare the output voltage with a threshold voltage and thereby generate a voltage detection result.

8. A voltage detector comprising:
an alternating-current coupling circuit configured to generate a first input voltage and a second input voltage according to a source input voltage;
a feedback amplifier configured to output a branch current according to a sink current and determine an output voltage according to the first input voltage and an amount of the branch current; and
an auxiliary circuit configured to output an amount of the sink current according to the second input voltage, wherein the sink current includes the branch current,
wherein the source input voltage is composed of two voltages of a differential signal, the first input voltage is composed of two voltages of another differential signal, and the second input voltage is composed of two voltages of yet another differential signal, and the alternating-current coupling circuit includes:
a first terminal configured to receive a positive-terminal input of the source input voltage;
a second terminal configured to receive a negative-terminal input of the source input voltage;
a first alternating-current coupling circuit configured to generate the first input voltage according to the positive-terminal input, the negative-terminal input and a first bias; and
a second alternating-current coupling circuit configured to generate the second input voltage according to the positive-terminal input, the negative-terminal input and a second bias.

9. The voltage detector of claim 8, wherein the auxiliary circuit includes:
a current source configured to output a predetermined current; and
a current sink configured to draw the sink current including the predetermined current and the branch current.

10. The voltage detector of claim 9, wherein the current sink includes: a second voltage input circuit configured to output the amount of the sink current according to the second input voltage.

11. The voltage detector of claim 9, wherein the current source is configured to output the predetermined current according to a third bias while a ratio of the third bias to the second bias is constant or configurable.

12. The voltage detector of claim 11, further comprising a bias generating circuit including:

a bias current source configured to determine a reference current;
a bias current mirror configured to generate a mirror current according to the reference current, in which a gate voltage of the bias current mirror acts as the second bias; and
a diode-connected transistor, in which a gate voltage of the diode-connected transistor acts as the third bias and the mirror current passes through the diode-connected transistor.

13. A communication circuit including a voltage detector, the communication circuit comprising:
a radio-frequency circuit configured to process a reception signal according to an amplifier gain and thereby generate a source input voltage;
the voltage detector including:
an alternating-current coupling circuit configured to generate a first input voltage and a second input voltage according to the source input voltage;
a feedback amplifier configured to output a branch current according to a sink current and determine an output voltage according to the first input voltage and an amount of the branch current; and
an auxiliary circuit configured to output an amount of the sink current according to the second input voltage, wherein the sink current includes a sum of a predetermined current from a current source of the auxiliary circuit and the branch current, and the branch current is not outputted from the current source;
a comparing circuit configured to compare the output voltage with a threshold voltage and thereby generate a voltage detection result; and
a gain adjusting circuit configured to adjust the amplifier gain according to the voltage detection result.

14. The communication circuit of claim 13, wherein the feedback amplifier includes:
a first voltage input circuit configured to determine a first output voltage of an output terminal according to the first input voltage and determine a conduction current according to the first input voltage, in which the conduction current passes through the first voltage input circuit;
a current mirror circuit coupled to the output terminal and configured to generate a first current according to the first output voltage, in which the first current includes the branch current and the conduction current; and
an output feedback circuit coupled to the current mirror circuit and configured to generate the output voltage.

15. The communication circuit of claim 13, wherein the auxiliary circuit includes:
the current source configured to output the predetermined current; and
a current sink configured to draw the sink current according to the second input voltage.

16. The communication circuit of claim 15, wherein the current sink includes: a second voltage input circuit configured to determine the output of the sink current according to the second input voltage.

* * * * *